United States Patent [19]

Nakamura

[11] Patent Number: 5,081,073
[45] Date of Patent: Jan. 14, 1992

[54] SUPERCONDUCTING CERAMIC STRUCTURE

[75] Inventor: Takashi Nakamura, Ichihara, Japan

[73] Assignee: Dow Corning Toray Silicone Company, LTD., Tokyo, Japan

[21] Appl. No.: 600,563

[22] Filed: Oct. 19, 1990

[30] Foreign Application Priority Data

Oct. 31, 1989 [JP] Japan .................. 1-284311

[51] Int. Cl.⁵ .............................. B32B 9/00
[52] U.S. Cl. ....................... 505/1; 505/70.1; 505/702; 505/703; 505/704; 428/446; 428/688; 428/901; 428/930; 428/76
[58] Field of Search ............... 505/1, 701–4; 428/446, 688, 901, 930, 76

[56] References Cited

FOREIGN PATENT DOCUMENTS 64-7412  1/1989  Japan .

*Primary Examiner*—Patrick J. Ryan
*Attorney, Agent, or Firm*—Roger E. Gobrogge

[57] ABSTRACT

The present invention relates to a superconducting ceramic structure consisting of a superconducting ceramic substrate whose surface carries a film plasma-polymerized from a silazane bond-containing organosilicon compound. This structure is characterized by the absence of deterioration in its superconducting properties even upon contact with water or water vapor, and thus by the long-term retention of its superconducting properites.

6 Claims, 1 Drawing Sheet

SUPERCONDUCTING CERAMIC STRUCTURE

BACKGROUND OF THE INVENTION

The present invention relates to a highly durable superconducting ceramic structure. The durability described herein has been achieved by the formation of a 10 to 5,000 nanometer-thick plasma-polymerization film of a silazane bond-containing organosilicon compound on the surface of a superconducting ceramic substrate.

Since 1986, a succession of superconducting ceramics based on layered perovskite structures has been discovered. Such ceramics have superconducting transition temperatures (Tc) above the temperature of liquid nitrogen (77.3K) and may be classified into essentially the following three types: the Y-Ba-Cu-O system (Tc=approximately 90K. Phys. Rev. Lett., 58, 405 (1987), etc.), the Bi-Pb-Sr-Ca-Cu-O system (Tc=approximately 120K, Jpn. J. Appl. Phys., 27, L1041 (1988), etc.), and the Tl-Ba-Ca-Cu-O system (Tc=approximately 120K, Nature, 332, 138 (1988), etc.). While the Y-Ba-Cu-O system is easy to synthesize and has a wide composition range over which superconductivity may appear, it has a low Tc. The Bi-Pb-Sr-Ca-Cu-O system does not contain rare-earth elements and has a high Tc but, it has a narrow composition range which permits superconductivity. Finally, the Tl-Ba-Ca-Cu-O system has a high Tc but, the toxicity of thallium is a matter of concern.

Although these three types have both advantages and disadvantages, each has the outstanding attribute of being extremely valuable from an industrial standpoint since in each case Tc exceeds the temperature of liquid nitrogen. In other words, it now becomes possible to use a liquid nitrogen coolant in place of the liquid helium or liquid hydrogen heretofore used. Not only is this highly advantageous from the standpoint of coolant cost and supply, but one can anticipate the appearance of practical products which, from the standpoints of fabrication or application, would have been impossible for prior superconductors.

Because the superconducting ceramics typified by the preceding 3 types may be fabricated in various forms such as bulk, thin films, and wire materials, a broad range of applications can be envisioned for them. For example, one can contemplate the application of wire materials in energy distribution and storage sectors centered on power transmission lines and coils, etc.; the application of the bulk form in devices which use magnets, magnetic shielding, etc.; and the application of thin films in SQUIDs (superconducting quantum interference devices), Josephson junction-based sensors, computer circuitry, etc. Research directed at practical realization is currently very active.

However, it has become clear that contact with water substantially degrades the properties of these superconducting ceramics. For example, in the Y-Ba-Cu-O system a reduction in critical current has been observed, regardless or form, upon standing in air (1987 International Superconductivity Electronics Conference, Rump Session, etc.) and a reduction in Tc and an increase in resistance have been observed upon immersion in hot water (Denshi Joho Tsushin Gakkai Gijutsu Kenkyu Hokoku [Technology Research Reports of the Institute of Electronics, Information, and Communication Engineers], 88 (22), 31 (1988), etc.). The same phenomena have been reported for the Tl-Ba-Ca-Cu-O system. Moreover, although the degree of the decline is less in the Bi-Pb-Sr-Ca-Cu-O system than in the Y-Ba-Cu-O system (Denshi Joho Tsushin Gakkai Gijutsu Kenkyu Hokoku, 88 (146), 19 (1988)), it is estimated that a decline occurs to the same performance level upon long-term contact with water.

These deterioration phenomena are considered to be the biggest bottleneck to practical realization. For example, when these superconducting ceramics are used in microelectronic products such as Josephson devices, transistors. LSI circuitry, and so forth, there is a substantial risk of contact between the superconductor element and the atmosphere during the fabrication, storage, and product use stages. Moreover, water-wash processes (for example, wet etching, etc.) used during fabrication may also subject the superconductor to water. In addition, since moisture readily condenses during immersion in liquid nitrogen in the product use stage, there exists a high risk of contact with water or water vapor. The same high risk of contact with water or water vapor can be easily envisioned for other spheres of application.

Accordingly, it is clear that the most significant problem in the practical realization of superconducting ceramics is the implementation of some means for inhibiting or suppressing the decline in superconducting properties due to water or water vapor. The following methods have been proposed to date as solutions to this problem:

1) methods which induce surface modification by exposing the surface of the superconducting ceramic to an oxygen plasma, etc., and 2) methods based on the formation of a protective film of a metal or organic compound which can prevent the influx of moisture into the superconducting ceramic.

With regard to method 1), not only can it be difficult to form a film which can permanently intercept moisture, but this can also lead to a deterioration in performance (reduction in current density, etc.) through a partial destruction of the superconducting phase. Method 2) is effective in guaranteeing preliminary or feed conductive paths or channels when a protective metal film is formed on a wire superconducting ceramic. However, in other spheres, for example, application in device wiring, etc., this approach cannot be employed due to the high insulation requirements.

Chemical vapor-deposition of protective organic films under method 2 above (i.e., plasma polymerization of monomeric organic compounds) has been proposed based on the following reasons: films can be formed even from compounds which lack functional groups, pinhole-free films are obtainable, films with thicknesses less than 1 micrometer are readily accessible, adherence between the thin film and substrate is good, the obtained film has a crosslinked structure, and the properties of the film can be adjusted from organic to inorganic according to the conditions. For example, a method for protecting superconductors has been reported in which a plasma-polymerized thin film (monomer=trifluoromethane) is formed on the surfaces of Y-Ba-Cu-O and Bi-Sr-Ca-Cu-O superconducting thin films (Denshi Joho Tsushin Gakkai Gijutsu Kenkyu Hokoku, 88 (22), 31 (1988), and ibid., 88 (146), 19 (1988)). It was reported that this stopped the deterioration in superconducting properties due to immersion in water or heating in the atmosphere. Nevertheless, these methods still do not provide a permanent protective effect against these environments and have an unsatisfactory protective effect against water vapor.

The present inventor carried out extensive research directed at solving the problems described above and discovered that the formation of a plasma-polymerized film from specific organosilicon compounds on the surface of a superconducting ceramic substrate leads to stable superconducting properties without the problems listed above.

SUMMARY OF THE INVENTION

The present invention relates to a superconducting ceramic structure which is characterized by the formation of a 10 to 5,000 nanometer-thick plasma-polymerization film of a silazane bond-containing organosilicon compound on the surface of a superconducting ceramic substrate.

DETAILED DESCRIPTION OF THE INVENTION

Figure 1:
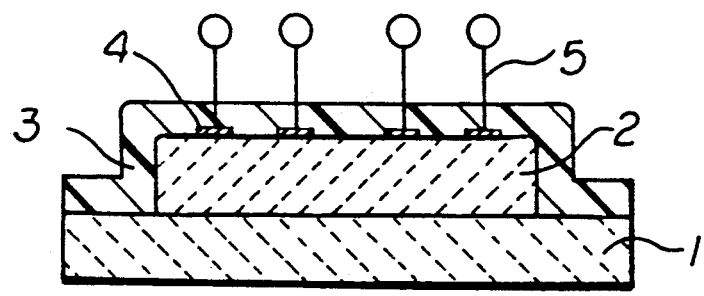
FIG. 1 contains a cross section of the superconductivity measurement unit of a superconducting ceramic structure according to the present invention.
1: printed base
2: superconducting ceramic substrate
3: plasma-polymerized protective film
4: gold electrode
5: lead wire FIG. 2 reports the relationship between measurement temperature and volume resistivity for sample 1 (superconducting ceramic structure of the present invention prepared in Example 1) and blank 1 (superconducting ceramic structure on which the plasma-polymerization film was not executed).

The present invention is based on the discovery that the formation of a plasma-polymerized film derived from specific organosilicon compounds on the surface of a superconducting ceramic substrate leads to a highly durable superconducting ceramic structure whose superconducting properties do not deteriorate even upon contact with water vapor or water.

The superconducting ceramic substrate used by the present invention comprises a ceramic which manifests superconducting phenomena, i.e., a fabricated superconducting ceramic product. The form or configuration of this ceramic substrate is not specifically restricted and can be, for example, any of the known superconducting ceramics as described above, i.e., the Y-Ba-Cu-O system (Tc=approximately 90K. Phys. Rev. Lett., 58, 405 (1987), etc.), the Bi-Pb-Sr-Ca-Cu-O system (Tc=approximately 120K, Jpn. J. Appl. Phys., 27, L1041 (1988), etc.), and the Tl-Ba-Ca-Cu-O system (Tc=approximately 120K, Nature, 332, 138 (1988), etc.).

The superconducting ceramic structure of the present invention comprises a structure in which a plasma-polymerized film of a silazane bond-containing organosilicon compound has been formed on the surface of such a superconducting ceramic substrate. While no particular restriction is placed on the structure of this silazane bond-containing organosilicon compound, straight-chain and cyclic organosilazane oligomers which have suitable vapor pressures are advantageous. The silicon-bonded organic groups are illustrated by alkyl groups such as methyl, ethyl, propyl, etc.; aryl groups such as phenyl, naphthyl, etc.; and aliphatically unsaturated hydrocarbon groups such as vinyl and allyl. It is preferred that a majority of these groups be methyl since they can be easily synthesized and it is also preferred that the organosilicon compound have five and fewer silicon atoms in order that the compound will have a suitable vapor pressure. In addition, as long as the moisture-intercepting effect is not substantially reduced, the organosilicon compound may also contain alkoxy groups, alkenyl groups silicon-bonded hydrogen atoms, and so forth.

Examples of silazane bond-containing organosilicon compounds which satisfy these conditions are as follows: hexamethyldisilazane, octamethyltrisilazane. 1-phenylpentamethyldisilazane, 1,3-divinyltetramethyldisilazane, hexamethylcyclotrisilazane, octamethylcyclotetrasilazane, etc.

The organosilicon compound can be plasma-polymerized according to those technical means known in the art. For example, the superconducting ceramic substrate is placed in an evacuated chamber which contains gas of the starting monomer and a glow discharge then set up by electrodes placed inside or outside the chamber. This plasma-polymerization is advantageously conducted under moderate conditions in order to retain the monomer's structure to the greatest extent possible. Therefore, unnecessarily large amounts of power should be avoided and a water-cooled platform for mounting the superconducting ceramic substrate may be used.

The film thickness of the plasma-polymerization film must be 10 to 5,000 nanometers. Complete coverage of the superconducting ceramic substrate becomes problematic at thicknesses below 10 nanometers and the protective effect is qualitatively reduced. In excess of 5,000 nanometers, it is difficult to obtain a uniform film quality and the risk of a decline in protective effect arises. Moreover, such thicknesses may also have a significant effect on the dimensions and shape of the substrate. Thus, it is more preferred that the thickness of the plasma-polymerization film be 50 to 1,000 nanometers.

The superconducting ceramic structure described above has the superior attribute, among others, of long-term retention of its superconducting properties even in contact with water or water vapor. It will, therefore, be useful, for example, for the coils, power transmission lines, and so forth of energy storage and distribution devices, for magnetic or magnetic shielding devices, for sensors, for computer circuitry, and so forth.

The present invention is explained in greater detail through the following illustrative examples. The deposition thickness reported in the examples for the plasma-polymerization film was obtained as follows: plasma-polymerization was conducted under the same conditions (pressure, applied power) on a glass plate, the film thickness was measured using a film-thickness meter (contact needle method), and the deposition rate thus determined was used to calculate the deposition thickness. The following values were measured for the superconducting electrical properties: the volume resistivity at 25 degrees Centigrade (Rrt), the temperature of onset of the superconducting transition during sample cooling (Ton), the volume resistivity at Ton (Ron), the temperature at which the superconducting transition is complete (Tc), and the volume resistivity at Tc (Rc).

EXAMPLE 1

Yttrium oxide (Y2O3) powder, barium carbonate (BaCO3) powder, and cupric oxide (CuO) powder were weighed out in accordance with the elemental proportions of the formula Y Ba2 Cu3 Ox. These were mixed in ethanol and the ethanol was then removed. The obtained powder mixture was subjected to an intermediate bake for 3 hours at 900 degrees Centigrade in an electric furnace. This was removed, and after re-grinding and re-mixing, molded into a pellet (diameter=1 cm, thickness=approximately 1 mm) by the application of a pressure of approximately 500 kg/cm2. This pellet was baked for 15 hours at 900 degrees Centigrade in an electric furnace, then cooled to room temperature over approximately half a day while still in the electric furnace to afford the desired Y-Ba-Cu-O system superconducting ceramic substrate.

This pellet was cut in half, and 4 thin-film lines of gold (width approximately 1 mm) were laid down on the respective surfaces by vapor deposition to function as electrodes for the volume resistivity measurements. Copper lead wires (diameter=0.1 mm) were connected to these electrodes by conductive paint. The reverse side of this pellet was glued to a printed base (approximately 2 cm square) using an adhesive to give a unit for measurement of the superconducting properties (abbreviated below as the superconductivity measurement unit).

A grounded stainless steel platform (water-cooled, diameter=100 mm) was placed in a glass bell jar (diameter=25 cm), and electrodes (diameter 80 mm) were installed 20 mm above the platform. The superconductivity measurement unit was placed on the platform. After evacuating the interior, a current of hexamethyldisilazane was established so as to give an internal pressure of 0.35 mbar. Plasma polymerization was conducted for 30 minutes at a frequency of 13.56 MHz and an applied power of 10 watts. A superconducting ceramic structure was obtained which carried a plasma-polymerized protective film with a deposition thickness of 220 nanometers (sample 1). FIG. 1 gives the structure of the superconductivity measurement unit from which sample 1 (superconducting ceramic structure according to the present invention) was derived. The volume resistivity of the superconducting ceramic substrate was measured by the direct-current four-terminal method (80 mA current) on sample 1, and also on a superconductivity measurement unit which did not carry the aforesaid plasma-polymerized protective film (blank 1), while lowering the particular unit into a Dewar flask filled with liquid nitrogen. The volume resistivity-versus-temperature relationship was plotted in the range from room temperature to the temperature of liquid nitrogen (77.3K), and the superconductivity property values reported below were obtained. These measurement results confirm that both sample 1 and blank 1 exhibited a complete superconductivity.

| Sample 1: Rrt = 6.5 × 10−3 ohm-cm | |
|---|---|
| Ton = 87.5 K | Ron = 8.2 × 10−3 ohm-cm |
| Tc = 78.4 K | Rc: below 10−6 ohm-cm (below the detection limit) |
| Blank 1: Rrt = 6.5 × 10−3 ohm-cm | |
| Ton = 87.5 K | Ron = 8.2 × 10−3 ohm-cm |
| Tc = 78.4 K | Rc: below 10−6 ohm-cm (below the detection limit) |

Sample 1 and Blank 1 were then maintained for 24 hours in an atmosphere at 100% RH/25 degrees Centigrade, and the superconducting properties were measured as above to give the values reported below. These measurement results confirm that sample 1 was completely superconductive while blank 1 had suffered from a deterioration in superconducting properties.

| Sample 1: Rrt = 6.5 × 10−3 ohm-cm | |
|---|---|
| Ton = 87.5 K | Ron = 8.2 × 10−3 ohm-cm |
| Tc = 78.4 K | Rc: below 10−6 ohm-cm (below the detection limit) |
| Blank 1: Rrt = 1.2 × 10−2 ohm-cm | |
| Ton = 87.4 K | Ron = 1.9 × 10−2 ohm-cm |
| Tc: below 77.3 | |

Sample 1 was additionally maintained for 1 month in an atmosphere at 100% RH/25 degrees Centigrade, and the superconducting properties were then measured as above to give the values reported below. These measurement results confirm a complete retention of the superconducting properties of sample 1.

| Sample 1: Rrt = 6.8 × 10−3 ohm-cm | |
|---|---|
| Ton = 87.5 K | Ron = 8.5 × 10−3 ohm-cm |
| Tc = 78.3 K | Rc: below 10−6 ohm-cm (below the detection limit) |

Figure 2:
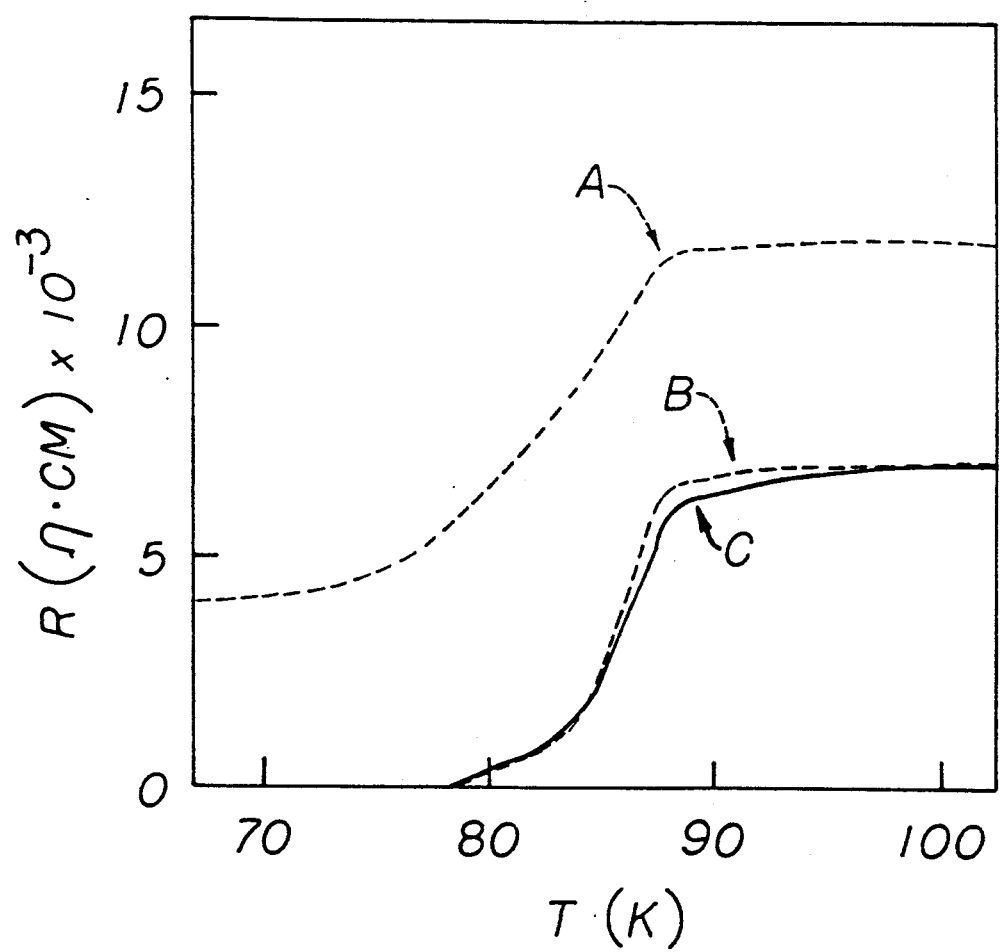
In FIG. 2, R=volume resistivity, T absolute temperature, solid line=measurement results for sample 1, dashed line=measurement results for blank 1.
A: after 24 hours in 100% RH atmosphere
B: initial
C: initial to after 1 month in 100% RH atmosphere

These changes in the volume resistivity-versus-temperature plot brought about by standing at 100% RH are reported for Sample 1 and Blank 1 in FIG. 2.

One observes here that the instant superconducting ceramic structure according to the invention (Sample 1) displays an excellent retention of its superconducting properties in the face of contact with water vapor.

EXAMPLE 2

A Sample 1 and Blank 1 obtained according to Example 1 were each immersed for 2 hours in hot water (50 degrees Centigrade), and their superconducting properties were then measured as in Example 1 to give the values reported below. These measurement results confirm that Sample 1 exhibited complete superconductivity while Blank 1 suffered from a decline in superconducting properties.

| Sample 1: Rrt = 7.0 × 10−3 ohm-cm | |
|---|---|
| Ton = 87.5 K | Ron = 8.4 × 10−3 ohm-cm |
| Tc = 78.2 K | Rc: below 10−6 ohm-cm (below the detection limit) |
| Blank 1: Rrt = 1.5 × 10−2 ohm-cm | |
| Ton: uncertain | |
| Tc: did not appear | |

One observes here that the instant superconducting ceramic structure according to the invention (Sample 1) manifests an excellent retention of its superconducting properties with respect to contact with water.

EXAMPLE 3

Hexamethylcyclotrisilazane was plasma-polymerized for 45 minutes using the method of Example 1 (internal pressure=0.35 mbar, applied power=10 watts) onto the surface of a superconductivity measurement unit containing a superconducting ceramic substrate with the same composition as Example 1 (fabricated as in Example 1). The product was a superconducting ceramic structure which carried a plasma-polymerized protective film with a deposition thickness of 210 nanometers (Sample 2).

The superconducting properties of Sample 2 were measured as in Example 1 to obtain the following values, which confirm the appearance of complete superconductivity.

$Rrt = 6.5 \times 10-3$ ohm-cm
$Ton = 87.5$ K  $Ron = 8.2 \times 10-3$ ohm-cm
$Tc = 78.4$ K  Rc: below $10-6$ ohm-cm (below the detection limit)

Sample 2 was then maintained for 1 week in an atmosphere at 100% RH/25 degrees Centigrade and its superconducting properties were subsequently measured as above to give the values reported below.

$Rrt = 6.7 \times 10-3$ ohm-cm
$Ton = 87.5$ K  $Ron = 8.6 \times 10-3$ ohm-cm
$Tc = 78.4$ K  Rc: below $10-6$ ohm-cm (below the detection limit)

EXAMPLE 4

Bismuth oxide (Bi2O3) powder, lead (II,III) oxide (Pb3O4) powder, strontium carbonate (SrCO3) powder, calcium carbonate (CaCO3) powder, and cupric oxide (CuO) powder were weighed out in the elemental proportions of the formula Bi0.7 Pb0.3 Sr Ca Cu1.8 Ox, mixed in ethanol, and the ethanol was removed. The obtained powder mixture was subjected to an intermediate bake for 24 hours at 850 degrees Centigrade in an electric furnace. This was removed and re-ground and re-mixed, then formed into a pellet (diameter=1 cm, thickness=approximately 1 mm) by the application of a pressure of approximately 500 kg/cm2. This pellet was subsequently baked for 96 hours at 850 degrees Centigrade in an electric furnace followed by cooling by standing in the air to afford the desired Bi-Pb-Sr-Ca-Cu-O superconducting ceramic substrate.

A superconductivity measurement unit containing this Bi-Pb-Sr-Ca-Cu-O superconducting ceramic substrate was fabricated as in Example 1, and hexamethyldisilazane was plasma-polymerized onto its surface by the same method as in Example 1 (30 minutes, internal pressure=0.35 mbar, applied power=10 watts). The product was a superconducting ceramic structure having a plasma-polymerized protective film with a deposition thickness of 220 nanometers (Sample 3).

The superconducting properties were measured on Sample 3 as in Example 1 as well as on a unit lacking the aforesaid plasma-polymerized protective film (Blank 2), and the measurement results reported below were obtained. It was confirmed that both Sample 3 and Blank 2 exhibited complete superconductivity.

Sample 3: $Rrt = 2.1 \times 10-2$ ohm-cm
$Ton = 110.3$ K  $Ron = 1.2 \times 10-2$ ohm-cm
$Tc = 77.4$ K  Rc: below $10-6$ ohm-cm (below the detection limit)

Blank 2: $Rrt = 2.1 \times 10-2$ ohm-cm
$Ton = 110.3$ K  $Ron = 1.2 \times 10-2$ ohm-cm
$Tc = 77.4$ K  Rc: below $10-6$ ohm-cm (below the detection limit)

Sample 3 and Blank 2 were then maintained for 1 year in an atmosphere at 100% RH/25 degrees Centigrade, and the superconducting properties were measured as before to give the values reported below. These measurement results confirm that Sample 3 retained its complete superconductivity while the superconducting properties of Blank 2 deteriorated.

Sample 3: $Rrt = 2.1 \times 10-2$ ohm-cm
$Ton = 110.1$ K  $Ron = 1.2 \times 10-2$ ohm-cm
$Tc = 77.4$ K  Rc: below $10-6$ ohm-cm (below the detection limit)
Blank 2: $Rrt = 3.4 \times 10-2$ ohm-cm
$Ton = 102.9$ K  $Ron = 4.9 \times 10-2$ ohm-cm
$Tc = 77.3$ K

EXAMPLE 5

Barium carbonate (BaCO3) powder, calcium carbonate (CaCO3) powder, and cupric oxide (CuO) powder were weighed out according to the elemental proportions of the formula Tl2 Ba2 Ca2 Cu3 Ox, mixed in ethanol, and the ethanol was removed. The obtained powder mixture was subjected to an intermediate, two-stage bake in an electric furnace (96 hours/850 degrees Centigrade, 120 hours/900 degrees Centigrade). This was removed, thallium oxide (Tl2O3) powder was added in a quantity corresponding to formula (3) below followed by grinding and mixing. A pellet (diameter=1 cm, thickness=approximately 1 mm) was then prepared by the application of a pressure of approximately 500 kg/cm2. This pellet was sealed in an alumina crucible and baked in an electric furnace for 3 hours at 875 degrees Centigrade. The pellet was then cooled to room temperature in the electric furnace over approximately half a day to afford the desired Tl-Ba-Ca-Cu-O superconducting ceramic substrate.

A superconductivity measurement unit containing this Tl-Ba-Ca-Cu-O superconducting ceramic substrate was fabricated, and hexamethyldisilazane was plasma-polymerized on its surface by the same method as in Example 1 (30 minutes, internal pressure=0.35 mbar, applied power=10 watts). The product was a superconducting ceramic structure having a plasma-polymerized protective film with a deposition thickness of 220 nanometers (Sample 4).

The superconducting properties were measured as in Example 1 on this Sample 4 as well as on the unit which did not carry the aforesaid plasma-polymerized protective film (Blank 3), and the measurement results reported below were obtained. It was confirmed that both Sample 4 and Blank 3 exhibited complete superconductivity.

Sample 4: $Rrt = 5.0 \times 10-3$ ohm-cm
$Ton = 121.3$ K  $Ron = 1.7 \times 10-3$ ohm-cm
$Tc = 111.9$ K  Rc: below $10-6$ ohm-cm (below the detection limit)
Blank 3: $Rrt = 5.0 \times 10-3$ ohm-cm
$Ton = 121.3$ K  $Ron = 1.7 \times 10-3$ ohm-cm
$Tc = 111.9$ K  Rc: below $10-6$ ohm-cm (below the detection Sample 4 and Blank 3 were then maintained for 48 hours in an atmosphere at 100% RH/25 degrees Centigrade, and the superconducting properties were measured as above to give the values reported below. It was confirmed that Sample 4 exhibited complete superconductivity while the superconducting properties of Blank 3 had deteriorated.

Sample 4: $R_{rt} = 5.0 \times 10^{-3}$ ohm-cm
$T_{on} = 121.3$ K  $R_{on} = 1.7 \times 10^{-3}$ ohm-cm
$T_c = 111.9$ K   $R_c$: below $10^{-6}$ ohm-cm (below the detection limit)

Blank 3: $R_{rt} = 1.3 \times 10^{-2}$ ohm-cm
$T_{on} = 120.5$ K  $R_{on} = 9.3 \times 10^{-3}$ ohm-cm
$T_c = 105.8$ K   $R_c = 1.8 \times 10^{-5}$ ohm-cm Sample 4 was additionally maintained for 2 months in a 100% RH atmosphere, and its superconducting properties were then measured as above to give the values reported below. A complete superconductivity retention was confirmed for Sample 4.

Sample 4: $R_{rt} = 5.1 \times 10^{-3}$ ohm-cm
$T_{on} = 121.3$ K  $R_{on} = 1.8 \times 10^{-3}$ ohm-cm
$T_c = 111.9$ K   $R_c$: below $10^{-6}$ ohm-cm (below the detection limit)

That which is claimed is:

1. A superconducting ceramic structure which is characterized by the formation of a 10 to 5,000 nanometer-thick plasma-polymerization film of a silazane bond-containing organosilicon compound on the surface of a superconducting ceramic substrate.

2. The superconducting ceramic structure according to claim 1 in which the organosilicon compound is an organosilazane oligomer having a linear or cyclic structure.

3. The superconducting ceramic structure according to claim 1 in which the organosilicon compound is a compound having no more than 5 silicon atoms.

4. The superconducting ceramic structure of claim 1 in which the superconducting ceramic substrate is selected from the group consisting of the Y-Ba-Cu-O system, the Bi-Pb-Sr-Ca-Cu-O system, and the Tl-Ba-Ca-Cu-O system.

5. The superconducting ceramic structure according to claim 1 in which the organosilicon compound is selected from the group consisting of hexamethyldisilazane, octamethyltrisilazane, 1-phenylpentamethyldisilazane, 1,3-divinyltetramethyldisilazane, hexamethylcyclotrisilazane and octamethylcyclotetrasilazane.

6. The superconducting ceramic structure according to claim 1 in which the plasma-polymerizing film is 50 to 1000 nanometers thick.

* * * * *